United States Patent
Ng et al.

(10) Patent No.: US 9,385,746 B1
(45) Date of Patent: Jul. 5, 2016

(54) DYNAMIC OFFSET CANCELLATION IN SIGMA-DELTA CONVERTER

(71) Applicant: Avago Technologies General IP (Singapore) Pte. Ltd., Singapore (SG)

(72) Inventors: Gek Yong Ng, Singapore (SG); Qian Tao, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/811,311

(22) Filed: Jul. 28, 2015

(51) Int. Cl.
  *H03M 3/00* (2006.01)
  *H04L 25/49* (2006.01)

(52) U.S. Cl.
  CPC ............... *H03M 3/356* (2013.01); *H03M 3/00* (2013.01); *H04L 25/4902* (2013.01)

(58) Field of Classification Search
  CPC ..... H03M 3/368; H03M 3/504; H03M 3/462; H03M 3/458; H03M 3/37; H03M 3/35; H03M 3/326; H03M 3/344; H03M 3/358; H03M 3/356; H04L 25/4902
  USPC .................................. 341/143–155; 375/146
  See application file for complete search history.

(56) References Cited

U.S. PATENT DOCUMENTS

| | | | | |
|---|---|---|---|---|
| 5,844,513 A * | 12/1998 | Nishio | ............. | G11B 20/10527 341/143 |
| 6,087,696 A * | 7/2000 | Li | .................... | H01L 21/28194 257/321 |
| 6,518,904 B1 * | 2/2003 | Jelonnek | ............. | H03M 7/3022 341/143 |
| 6,600,789 B1 * | 7/2003 | Lipasti | .................. | H03M 3/478 341/143 |
| 6,753,798 B2 * | 6/2004 | Feldtkeller | ............. | H02M 1/12 341/143 |
| 6,788,232 B1 * | 9/2004 | Lee | ..................... | H03M 7/3035 341/143 |
| 6,911,928 B2 * | 6/2005 | Orsier | .................. | H03M 3/404 341/143 |
| 7,180,432 B2 * | 2/2007 | Oliaei | ..................... | H03M 3/40 341/143 |
| 7,259,704 B2 * | 8/2007 | Mallinson | ............. | H03M 3/344 341/143 |
| 7,289,054 B1 * | 10/2007 | Watanabe | ............... | H03M 3/35 341/143 |
| 8,278,840 B2 * | 10/2012 | Logiudice | .......... | H05B 33/0818 315/193 |
| 8,666,343 B2 | 3/2014 | Shanan | | |
| 2011/0153640 A1 * | 6/2011 | Felderman | ........ | G06F 17/30011 707/769 |
| 2015/0061911 A1 | 3/2015 | Pagnanelli | | |
| 2015/0109281 A1 * | 4/2015 | Li | ............................ | G09G 3/32 345/212 |

* cited by examiner

Primary Examiner — Lam T Mai

(57) ABSTRACT

A sigma-delta converter, analog-to-digital conversion system, and an Integrated Circuit (IC) chip are disclosed that include a main sigma-delta modulator and an auxiliary sigma-delta modulator. The auxiliary sigma-delta modulator is electrically matched with the main sigma-delta modulator and is configured to generate an output that is incorporated into a feedback loop of the main sigma-delta modulator to enable the main sigma-delta modulator to adjust an offset signal applied at a main analog channel.

20 Claims, 11 Drawing Sheets

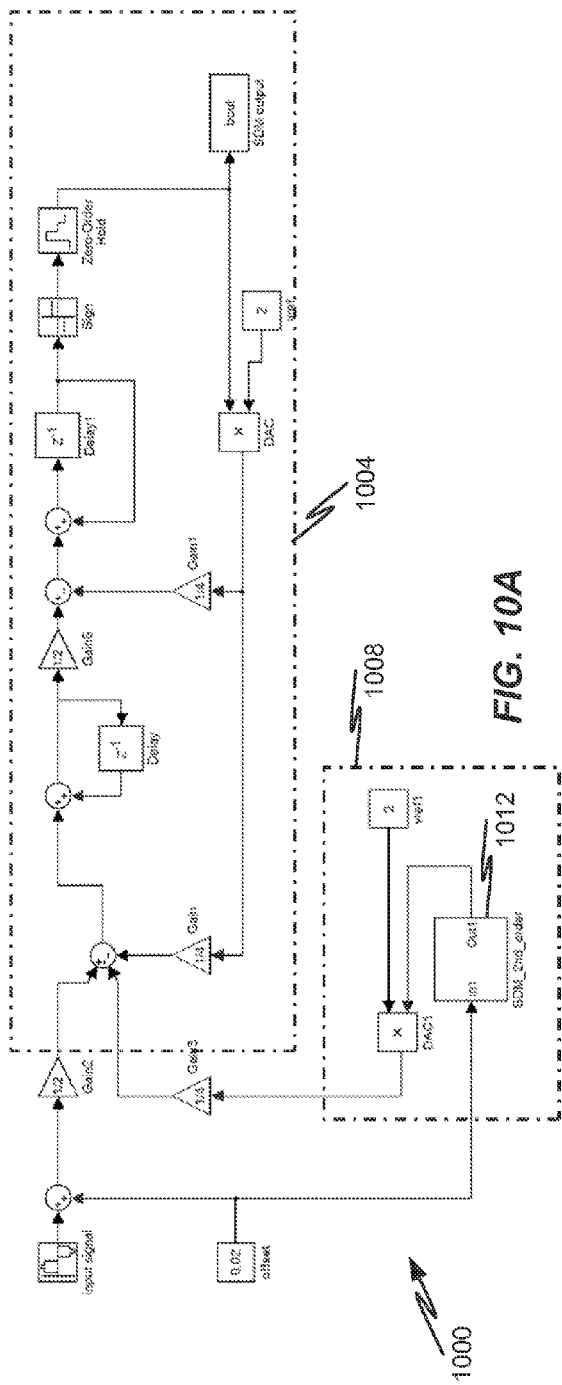
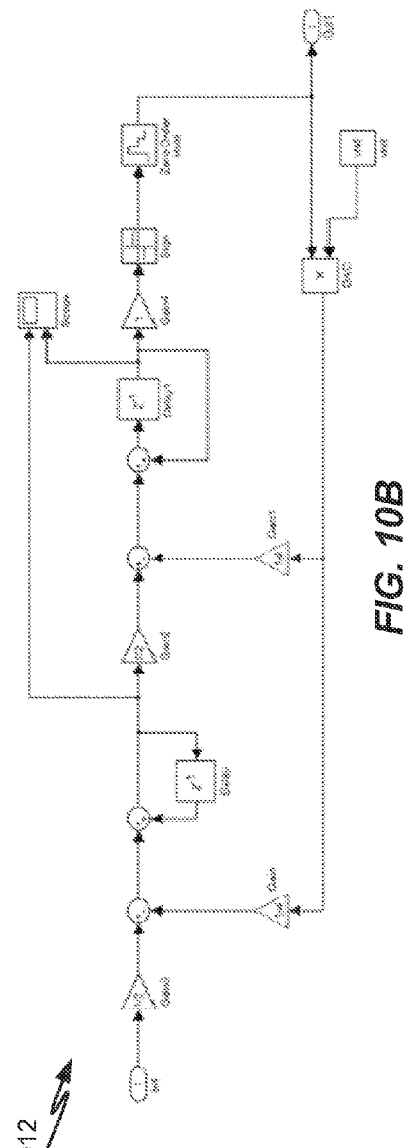
FIG. 10A
FIG. 10B

DYNAMIC OFFSET CANCELLATION IN SIGMA-DELTA CONVERTER

FIELD OF THE DISCLOSURE

The present disclosure is generally directed toward an analog-to-digital converter and, in particular, sigma-delta converters.

BACKGROUND

Industrial and automotive applications such as motor current sensing and battery voltage monitoring require precise measurement of the current or voltage level. Offset voltage present in a sensor chip used for precision current or voltage measurement will appear in the measurement reading and hence requires one-time calibration at the system level to remove this offset from the measurement. Offset voltage of a sensor chip is defined as the output voltage when the input signal is zero, in other words the condition when the input signal is connected to ground.

One-time offset calibration is performed by first connecting the input of the sensor chip to ground to measure the offset voltage at the output, and then subtracting this offset voltage from subsequent readings when the sensor is in normal operation. For practical reasons, calibration is performed only one time at nominal operating conditions. Hence, only a fixed offset is eliminated and so this scheme is only accurate for measurement done at the calibration conditions.

As offset changes over the device operating conditions such as temperature and supply voltage, and also varies from part to part due to manufacturing process shift, this calibration scheme is not effective to cancel offset due to drifts in operating environment. This calibration has to be performed for every sensor chip at the system level

BRIEF DESCRIPTION OF THE DRAWINGS

The present disclosure is described in conjunction with the appended figures, which are not necessarily drawn to scale:

FIG. 10A is a circuit diagram depicting a second-order sigma-delta modulator with a second-order sigma-delta modulator as the auxiliary offset compensation network in accordance with embodiments of the present disclosure;

FIG. 10B is a circuit diagram depicting details of the auxiliary second-order sigma-delta modulator in accordance with embodiments of the present disclosure;

DETAILED DESCRIPTION

Figure 1:
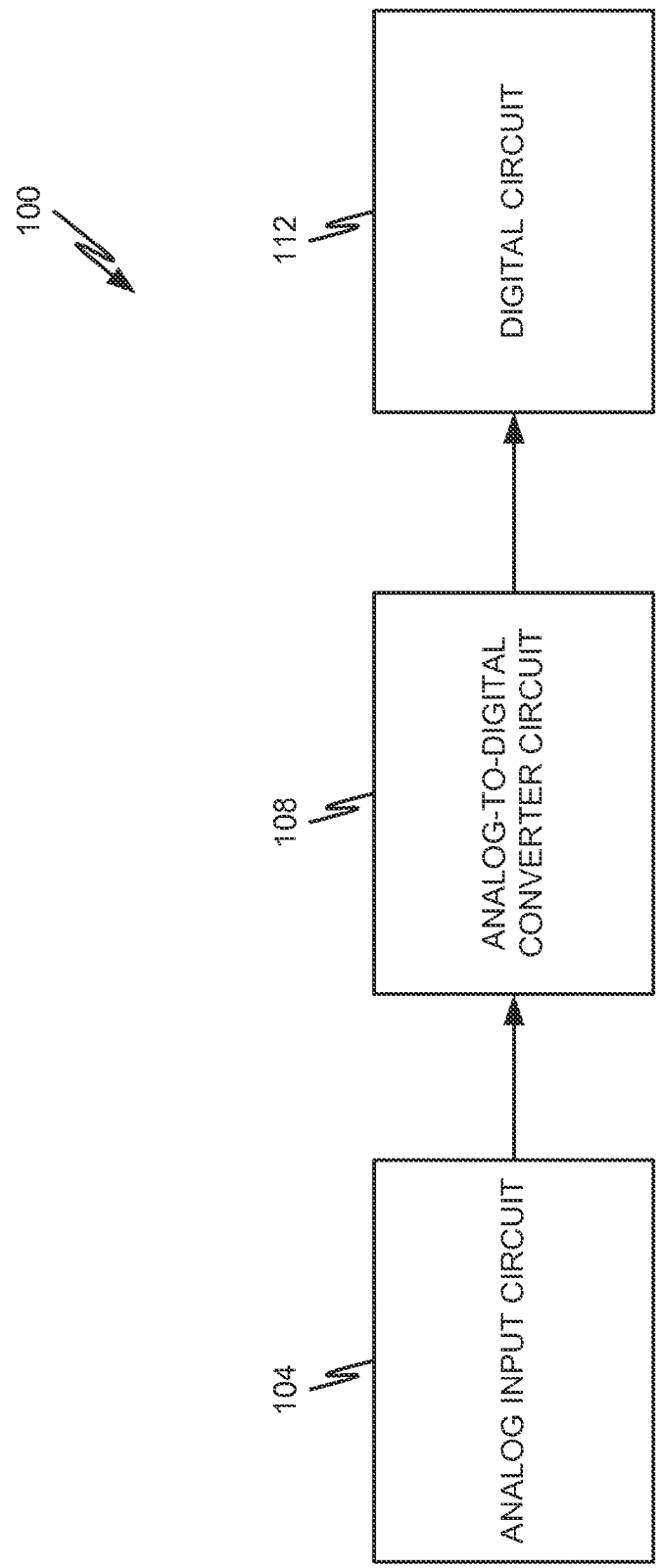
FIG. 1 is a block diagram depicting a communication system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

While embodiments of the present disclosure will be described in connection with a sigma-delta modulator, it should be appreciated that embodiments of the present disclosure are not so limited. In particular, the concepts described herein can be used for any type of analog-to-digital converter or converters or similar circuit configurations operating in a mixed signal (e.g., analog and digital) environment. While the particular type of low-level circuit described herein (e.g., a Serializer/Deserializer (SerDes)) is capable of utilizing the sigma-delta modulator system and method, other types of receivers or mixed signal communication system components can also benefit from the concepts described herein. Any type of Integrated Circuit (IC), IC chip, IC chip component, radar, audio/video signal processing, telephone system, etc. can utilize the sigma-delta modulator systems and methods described herein.

Accordingly, a sigma-delta modulator is disclosed herein. It is one aspect of the present disclosure to provide an offset calibration method and system for implementing said method in a feedback system on-chip as part of main sensor (e.g., voltage or current sensor) circuitry. In some embodiments, a dynamic calibration loop is used as it is always active and so the offset calibration is always effective over the entire device operating conditions. As the calibration loop experiences the same environment as the main sensor circuitry, the calibration loop eliminates not only the fixed offset but also offset drifts over the entire device operating conditions. As the calibration is within the sensor chip, there is no extra calibration effort at the system level and the measurement is always accurate and free of offset.

In some embodiments, an offset calibration loop is described that an auxiliary input branch coupled and matched electrically to the main sigma-delta converter/modulator, with the auxiliary input branch storing the offset of the main converter digitally, and then feeding this offset value back to the main converter through negative feedback, thus eliminating offset from the digital output of the main converter dynamically. It should be appreciated that the offset calibration loop and the auxiliary input branch for the offset calibration loop may be implemented in a number of different ways, some of which are depicted and described herein. Those of ordinary skill in the art will understand that any type of offset calibration loop can be used without departing from the scope of the present disclosure.

Referring now to FIG. 1, a mixed signal communication system 100 will be described in accordance with at least some embodiments of the present disclosure. The system 100 is shown to include an analog input circuit 104, an analog-to-digital converter circuit 108, and a digital circuit 112. The system 100 may be incorporated in a single IC chip, on a common circuit board, or as different circuits in different IC chips or circuits boards. In some embodiments, the system 100 may be included in one or more of a transmitter, receiver, or transceiver of a communication system. As a non-limiting example, the analog input circuit 104 may receive an analog signal from an analog signal source (e.g., over air, Ethernet, fiber optic, etc.). The analog input circuit 104 may comprise one or more circuit components (e.g., resistors, inductors, capacitors, diodes, etc.) that prepare the analog signal received at the analog input circuit 104 for transmission to the analog-to-digital converter circuit 108. As a non-limiting example, the analog input circuit 104 may comprise an antenna and filter components to extract over-air signals that have been modulated with data/information. Alternatively or additionally, the analog input circuit 104 may comprise a photodiode and series of resistors, inductors, and capacitors to convert a light signal received at a fiber optic interface into an analog signal suitable for transmission to the analog-to-digital converter circuit 108.

The analog-to-digital converter circuit 108 may include any type or collection of circuit components that are capable of converting the analog input signal received from the analog input circuit 104 into a digital signal. The digital signal can then be provided to the digital circuit 112 or multiple digital circuits 112 for processing with digital circuit components (e.g., logic circuits components, transistors, logic gates, logic switches, latches, etc.). The digital circuit 112 may be embodied as an IC on a single or multiple IC chips.

Figure 2:
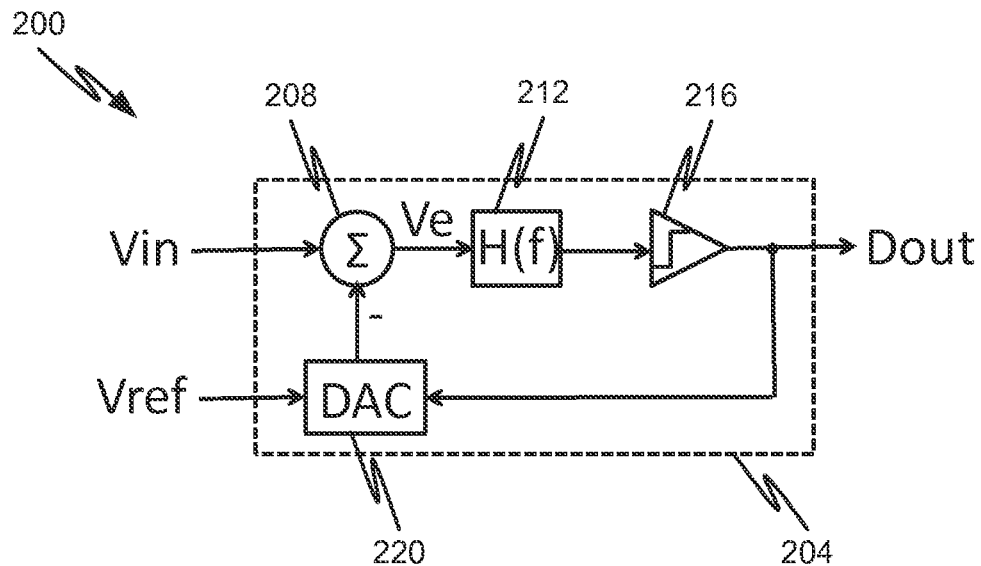
FIG. 2 is a block diagram depicting an ideal sigma-delta converter.

With reference now to FIG. 2, an illustrative ideal sigma-delta converter circuit 200 is depicted. The circuit 200 may correspond to an analog-to-digital converter front end in a sensor chip for precision current or voltage measurement. In other words, the circuit 200 may correspond to a type of circuit 200 that may be included in the analog-to-digital converter circuit 108.

The circuit 200 is shown to include a voltage input Vin, a reference voltage Vref, and a measured output Dout. The circuit 200 is also shown to include a summing node 208, a loop filter 212, a quantizer 216, and a feedback loop in which a digital-to-analog converter (DAC) 220 is situated.

The voltage input Vin may alternatively correspond to a current input Iin without departing from the scope of the present disclosure. The voltage input Vin may correspond to the analog input signal to be measured by the circuit 200. The reference voltage Vref may correspond to an analog input reference signal, for example ground or some other reference signal. The voltage input Vin and negative loop feedback of the DAC 220 are provided as inputs to the summing node 208 to determine an error voltage Ve. The error voltage Ve is provided to the loop filter 212, which may filter one or more frequencies or frequency bands of interest out of the error voltage Ve. The loop filter 212 provides its output to the quantizer 216 that generates the measured output Dout. In some embodiments, the measured output Dout corresponds to a digital output signal that is in the form of a bitstream of '1's' and '0's' with a pulse density, D, that represents the voltage input Vin as a ratio of the reference voltage Vref.

In the depicted embodiments, the circuit 200 is configured as a sigma-delta modulator or sigma-delta converter 204 (the terms may be used interchangeably). The sigma-delta modulator 204 is capable of producing a digital representation of the measured output Dout. In a steady state, the negative feedback loop containing the DAC 220 will make the error voltage Ve approximately zero, which essentially causes the voltage input Vin to equal the ratio of the reference voltage Vref times the measured output Dout. In other words, the error voltage Ve can be expressed as the following:

$$Ve = Vin * (Dout * Vref)$$

When the error voltage Ve is approximately equal to zero, then the voltage input Vin can be expressed as the following:

$$Vin = Dout * Vref$$

In an ideal system without offset, when the voltage input Vin equals zero, then the measured output Dout will also equal zero, which means that the measured output Dout is offset-free.

Figure 3:
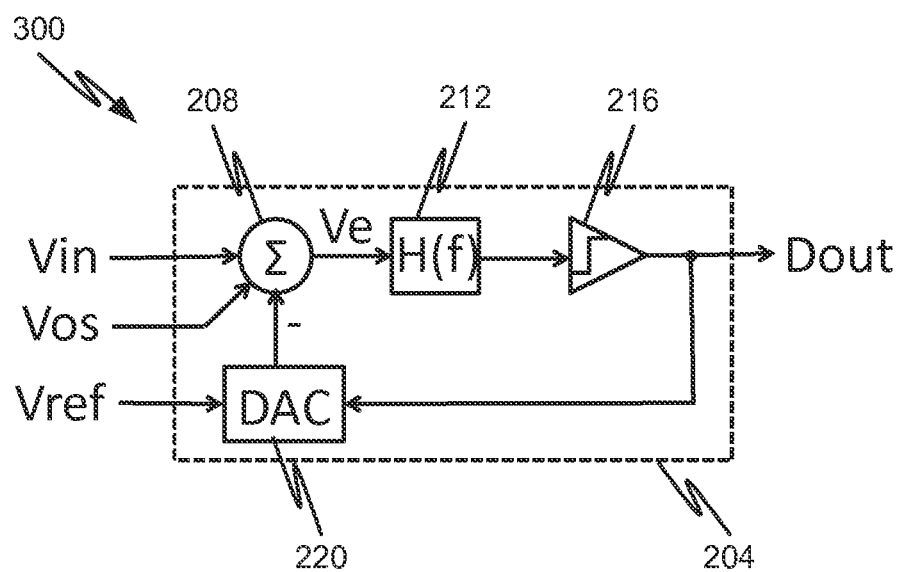
FIG. 3 is a block diagram depicting a sigma-delta converter with offset voltage.

With reference now to FIG. 3, details of a sigma-delta converter circuit with a static offset 300 is depicted. The circuit 300 is similar to circuit 200 except that circuit 300 includes an offset voltage Vos. The offset voltage Vos is provided as an additional input to the summing node 208. In all practical systems, offset is inherent in the signal path due to various reasons (e.g., device mismatches, signal routing imbalances, etc.). In steady state, the negative feedback loop will make the error voltage Ve approximately zero, which means that the sum of the voltage input Vin and the offset voltage Vos can be assumed to be equal to the measured output Dout times the reference voltage Vref.

When the voltage input Vin is zero, and the offset voltage Vos is not zero, then the measured output Dout will also not be zero, which means that the measured output Dout has an offset component. In particular, the measured output Dout can be expressed as the following where Dz is the offset-free pulse density representing the voltage input Vin and Dos is the pulse density representing the offset voltage Vos:

$$D=Dz+Dos$$

As can be appreciated, while adding a static offset at the input or subtracting a static offset from the output in the calibration process does solve some problems associated with the inherent offset of a circuit, there are still issues associated with using a static offset. In particular, the static offset does not compensate for dynamic changes in the circuit due to temperature conditions, voltage conditions, process variations, and/or noise. Thus, additional measures need to be taken.

Figure 4:
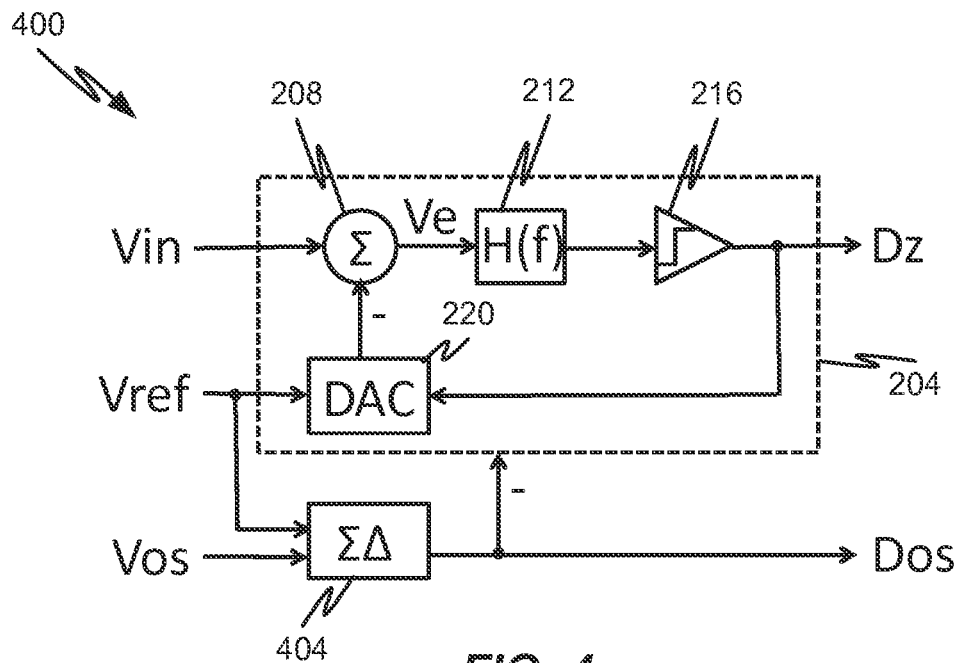
FIG. 4 is a block diagram depicting a sigma-delta converter with a negative feedback in accordance with at least some embodiments of the present disclosure.

With reference to FIG. 4, details of a circuit 400 comprising a dynamic offset calibration are shown in accordance with at least some embodiments of the present disclosure. The circuit 400 is similar to circuits 200, 300, except that an offset calibration loop is added to the main sigma-delta modulator 204. In particular, an auxiliary sigma-delta modulator 404 is provided in the offset feedback loop. In some embodiments, the auxiliary sigma-delta modulator 404 provides its output to the main sigma-delta modulator 204. Both sigma-delta modulators 204, 404 receive the same reference voltage Vref and are electrically matched with one another.

In the depicted embodiment, the auxiliary sigma-delta modulator 404 comprises the offset voltage Vos and the reference voltage Vref as its input. The auxiliary sigma-delta modulator 404 generates auxiliary output Dos, which is the pulse density representing the offset voltage Vos. The auxiliary output Dos is added to the main sigma-delta modulator 204 in a negative feedback loop, thereby resulting in the removal of the offset from the main sigma-delta modulator output Dz. Since the auxiliary sigma-delta modulator 404 is electrically matched to the main sigma-delta modulator 204, the offset voltage Vos can be emulated simply by connecting its inputs to ground.

Figure 5:
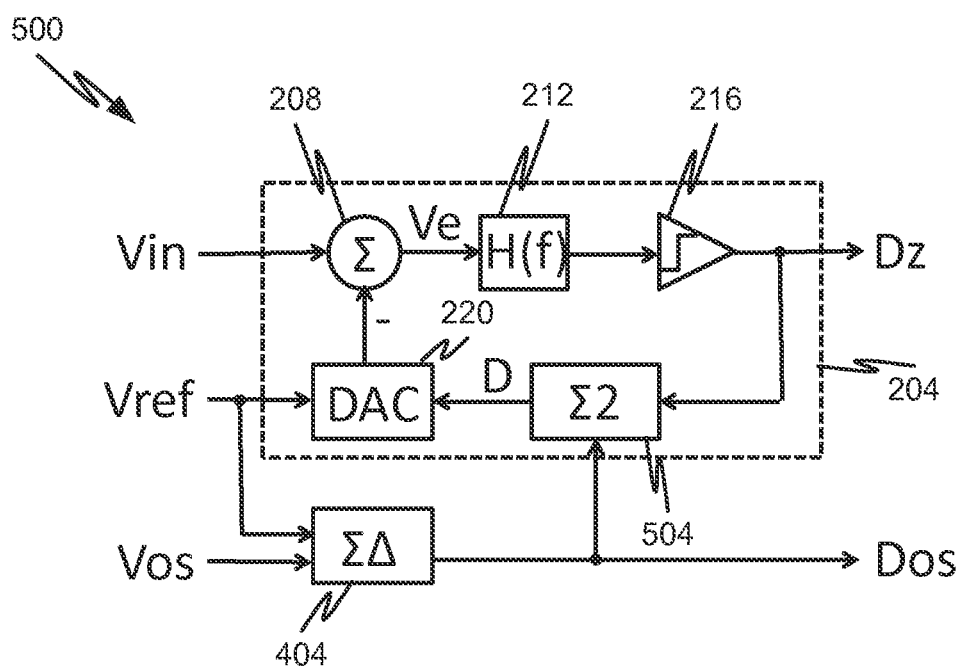
FIG. 5 is a block diagram depicting a first example of a sigma-delta converter implementing an offset calibration method in accordance with embodiments of the present disclosure.

With reference now to FIG. 5, details of a first example of a sigma-delta modulator circuit 500 implementing an offset calibration method will be described in accordance with embodiments of the present disclosure. The circuit 500 implements the feedback (e.g., interface between the auxiliary sigma-delta modulator 404 and main sigma-delta modulator 204) via a bitstream adder 504. The bitstream adder 504 digitally sums the auxiliary output Dos with the main sigma-delta modulator output Dz. The combined digital signal D then goes through the same DAC 220 of the main sigma-delta modulator 204 to convert to its analog equivalent for subtracting from the main analog signal path at the summing node 208.

By using the feedback mechanism depicted in FIG. 5, the offset inherently present in the main sigma-delta modulator 204 is capable of dynamically changing in response to different operating conditions (e.g., temperature, voltage, noise, process variations, etc.) about the circuit 500. Because the auxiliary sigma-delta modulator 404 experiences the same environment and is electrically matched with the main sigma-delta modulator 204, the offset (e.g., the auxiliary output Dos) is closely representative of the actual offset that is present at the main sigma-delta modulator 204.

Figure 6:
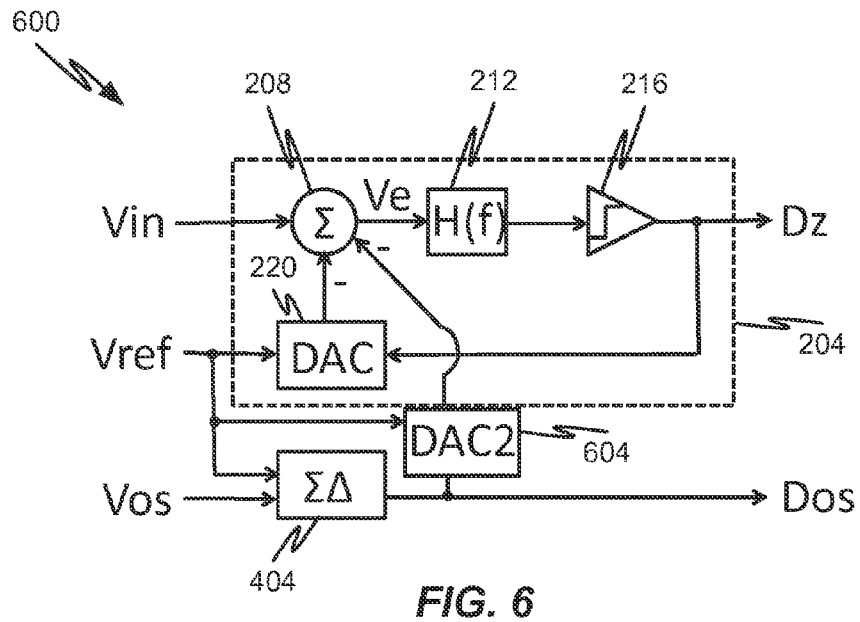
FIG. 6 is a block diagram depicting a second example of a sigma-delta converter implementing an offset calibration method in accordance with embodiments of the present disclosure.

With reference now to FIG. 6, details of a second example of a sigma-delta modulator circuit 600 implementing an offset calibration method will be described in accordance with embodiments of the present disclosure. The circuit 600 implements the feedback (e.g., interface between the auxiliary sigma-delta modulator 404 and main sigma-delta modulator 204) via a second DAC 604. The second DAC 604 receives the auxiliary output Dos and converts the digital signal Dos to its analog equivalent. The analog equivalent of the digital signal Dos is provided directly to the summing node 208 for subtraction from the main analog signal path.

In some embodiments, this additional path between the second DAC 604 and the summing node 208 acts like a second input to the main sigma-delta modulator 204, with its input containing the equivalent offset of the main sigma-delta modulator 204, resulting in zero offset in the final output Dz. This particular implementation may be easier to implement than the first method depicted in FIG. 5 since additional circuitry in the form of the bitstream adder is not necessary. By avoiding this additional circuitry, the total space required to implement the circuit 600 may be less than the total space required to implement the circuit 500. However, there are circumstances where it may be desirable to implement the circuit 500 instead of circuit 600. For instance, the overall performance and responsiveness of the circuit 500 may be better than that of circuit 600 because the digital bitstream output by the auxiliary sigma-delta modulator 404 is fed directly to the main sigma-delta modulator instead of having to travel through a DAC 604.

Figure 7:
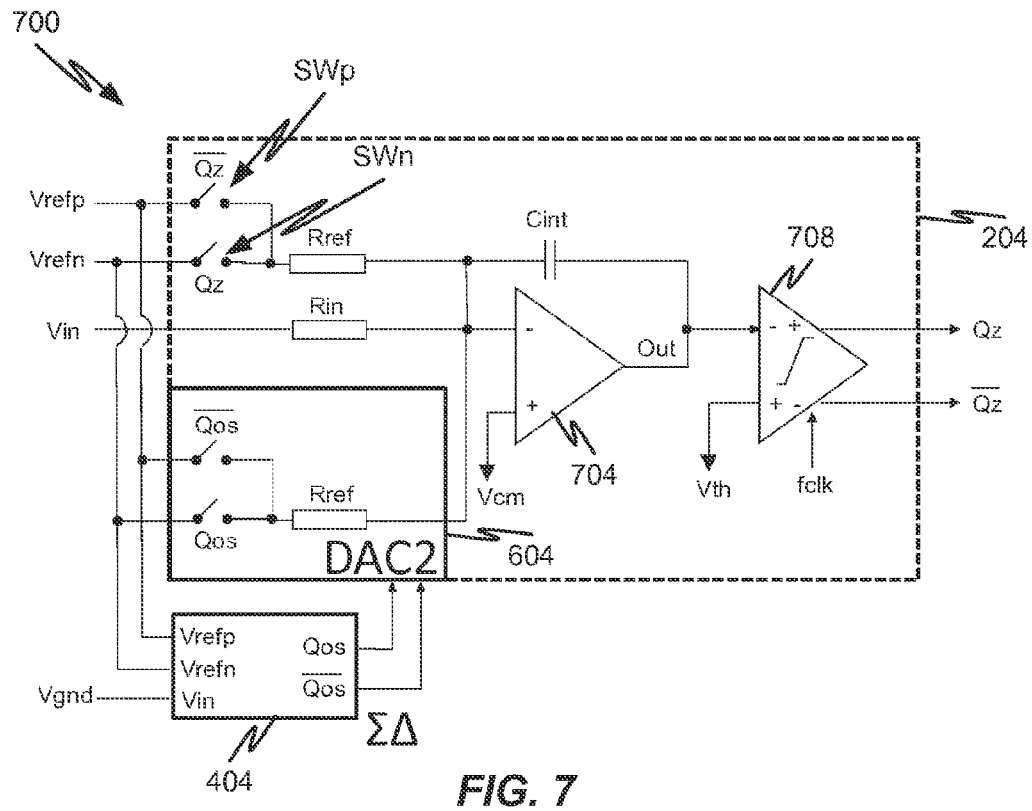
FIG. 7 is a detailed diagram of the sigma-delta converter depicted in FIG. 6.

One possible detailed implementation of the circuit 600 is shown in a detailed circuit diagram 700 depicted in FIG. 7. In particular, the circuit 700 shows the main sigma-delta modulator 204 as a continuous-time first order sigma-delta modulator having the auxiliary sigma-delta modulator 404 for dynamic offset calibration. The main sigma-delta modulator 204 of circuit 700 includes a pair of switches SWp and SWn that receive the reference voltage Vref. In some embodiments, the pair of switches SWp and SWn may correspond to transistors or the like, examples of which include both an n-type transistor and a p-type transistor. Any known type of transistor can be used. The outputs of the pair of the switches SWp and SWn are provided to a reference resistor Rref. The input of the main sigma-delta modulator 204 also includes the voltage input Vin, that passes through an input resistor Rin.

The reference resistor Rref and input resistor Rin may have their outputs connected to a common node, that is feed to an input of an amplifier 704. The amplifier 704 may have a capacitor Cint connected in parallel thereto, thereby enabling the amplifier 704 and capacitor Cint to collectively operate as filter 212. The output of the amplifier 704 is provided to a quantizer 708, which is an example of quantizer 216. The quantizer 708 is shown to output a pair of quantized/digital outputs Qz and Qzbar, which are used to control the two switches SWp and SWn.

The second DAC 604 is shown to include a reference resistor Rref, which may be similar or identical in resistance with the reference resistor Rref in the main sigma-delta modulator 204. In other words, the same reference resistor Rref is used because the auxiliary sigma-delta modulator 404 is electrically matched with the main sigma-delta modulator 204.

Figure 8A:
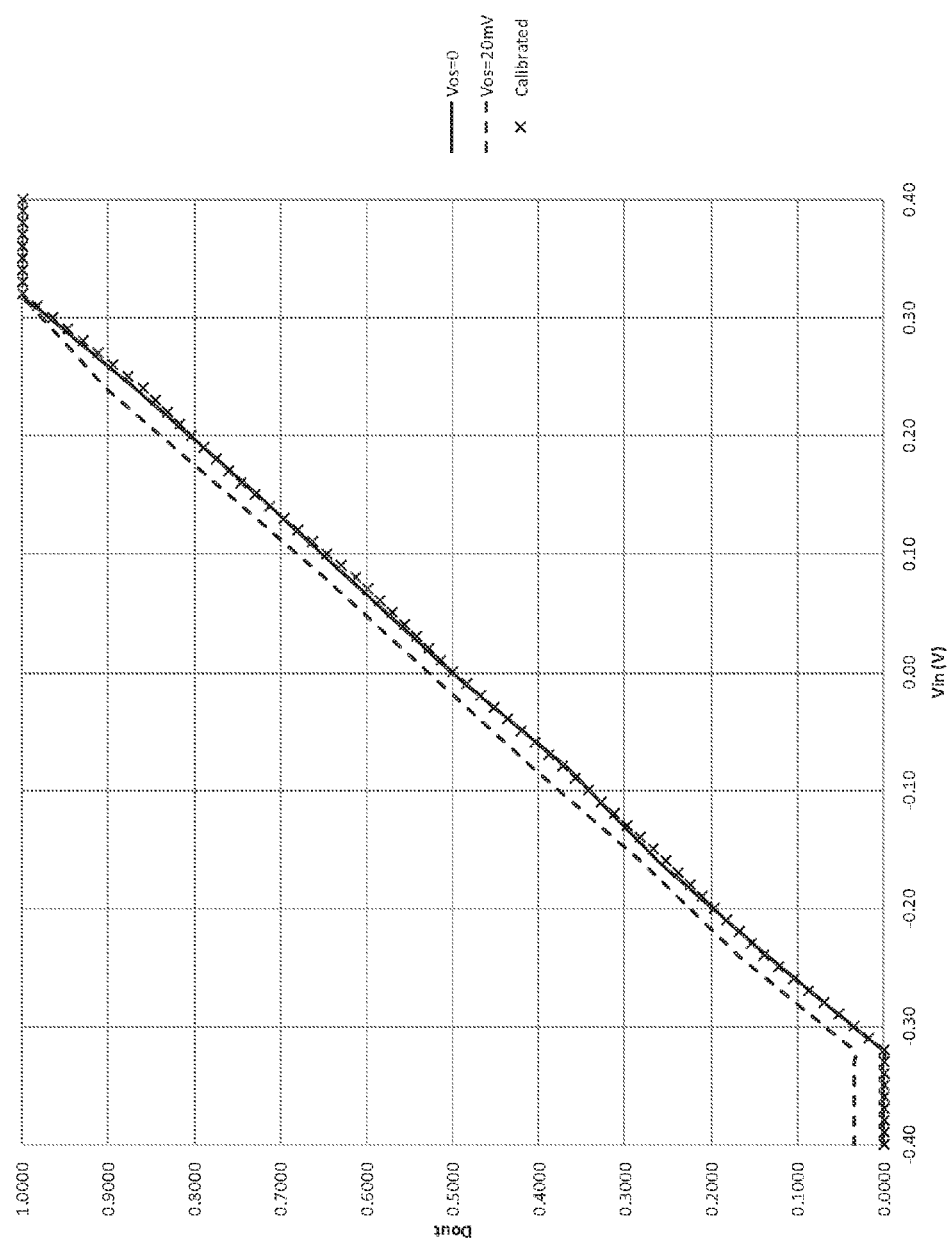
FIG. 8A is a graphical presentation of Dout vs. Vin for Vos=20 mV.
Figure 8B:
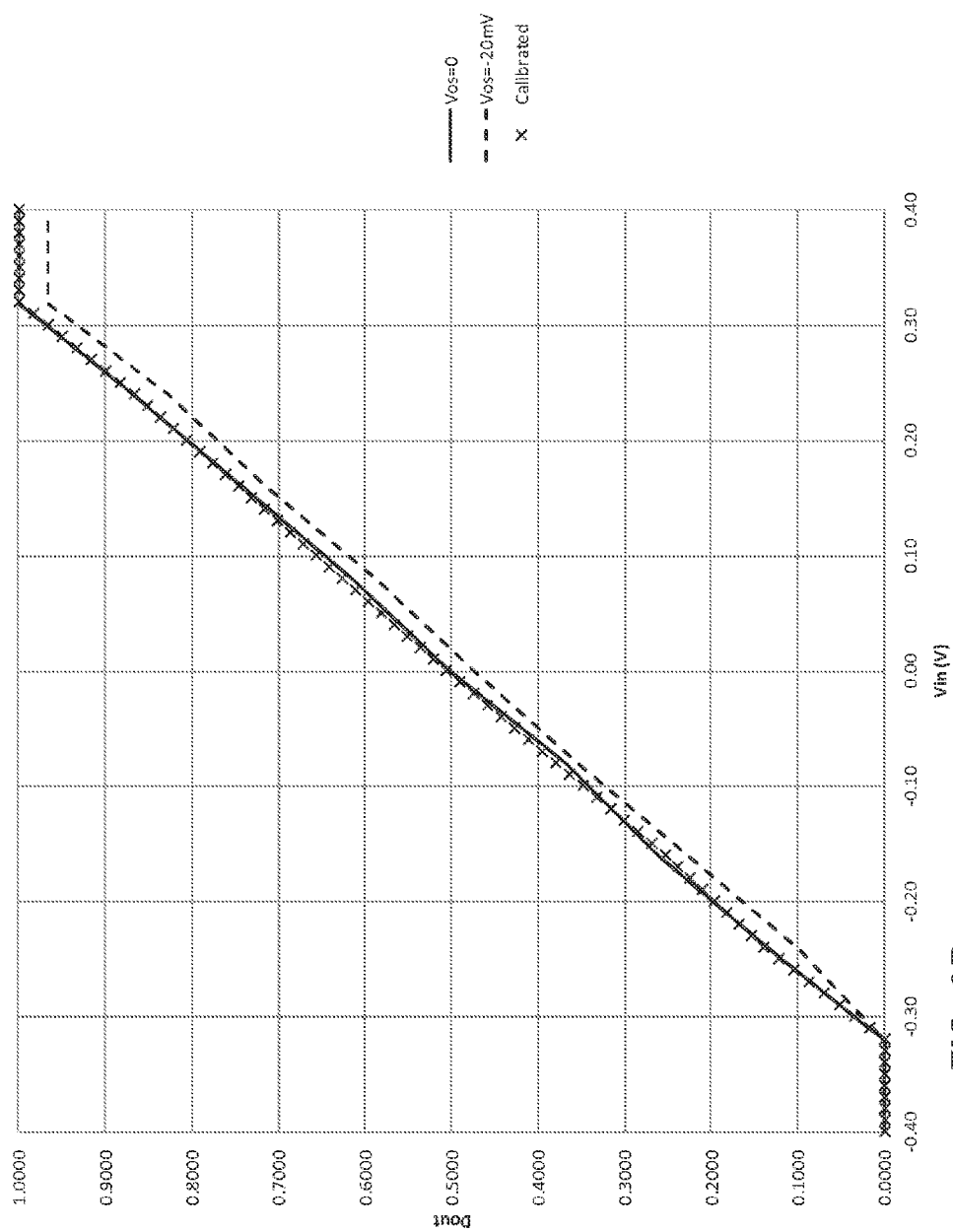
FIG. 8B is a graphical presentation of Dout vs. Vin for Vos=−20 mV.

FIGS. 8A and 8B depicts Vin vs. Dout plots for the circuit 700. The Vin vs. Dout transfer plots of the two sigma-delta modulators are shown with two different offsets. In particular, FIG. 8A shows the Vin vs. Dout transfer plot when Vos is approximately equal to 20 mV. FIG. 8B, on the other hand, shows the Vin vs. Dout transfer plot when Vos is approximately equal to −20 mV. It can be seen in both transfer plots that the offset calibrated sigma-delta modulator (denoted with "x") having input voltage Vin approximately equal to zero and Dout approximately equal to 0.5 exhibits an operation that substantially matches that of an ideal sigma-delta modulator without offset (e.g., circuit 300 where Vos is approximately equal to zero or the circuit 200 without any Vos).

Figure 9:
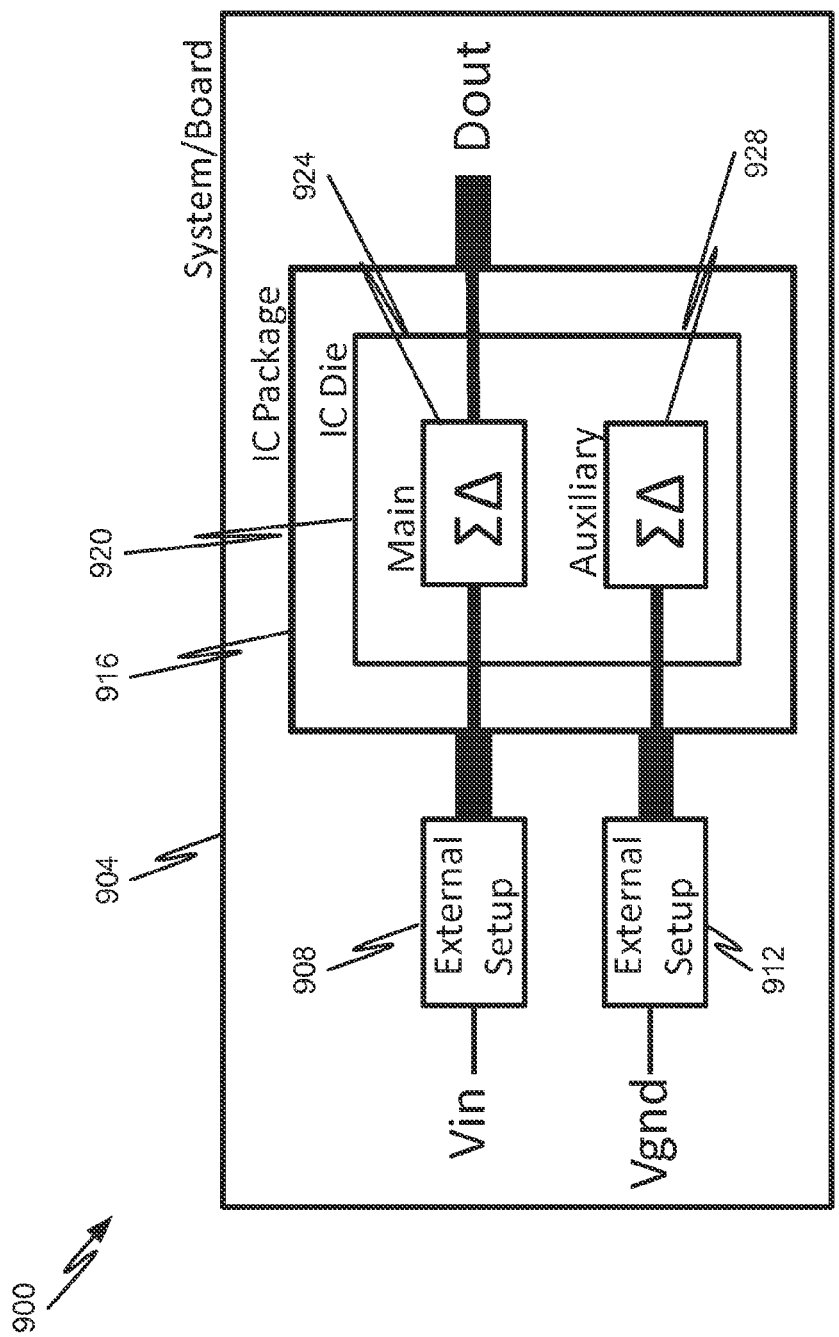
FIG. 9 is a block diagram depicting an analog-to-digital conversion system in accordance with embodiments of the present disclosure.

With reference now to FIG. 9, an analog-to-digital conversion system 900 will be described in accordance with at least some embodiments of the present disclosure. In particular, if the offset is not present internally in the on-chip signal path, but exists at the system level (e.g., due to external environment such as mismatches in package, board, or external operating environment), then the offset calibration loop can be applied to remove the external offset. As seen in FIG. 9, the system 900 may comprise a system/board 904 having an IC package 916 established thereon or connected thereto. The IC package 916 may comprise one or more IC dies 920. In the depicted embodiment, one of the IC dies 920 includes a main sigma-delta modulator 924 and an auxiliary sigma-delta modulator 928. The main sigma-delta modulator 924 and auxiliary sigma-delta modulator 928 may be connected to one another using any of the methods or circuit configurations depicted and described herein. The difference in this case of external offset calibration is that the input of the auxiliary sigma-delta modulator 928 is brought out onto the system or board level 904 and connected to experience the same environment as the main sensor 924, but with its input connected to ground Vgnd. Both the main sigma-delta modulator 924 and auxiliary sigma-delta modulator 928 may receive their inputs from various external board setup circuits 908, 912, respectively. These external setup circuits 908, 912 may be the same or different from one another and are generally used to ensure that the auxiliary signal path (auxiliary sigma-delta modulator 928 and external setup 912) experiences the same operating environment as the main signal path (sigma-delta modulator 924 and external setup 908).

With reference now to FIGS. 10-12, various models of second-order discrete-time sigma-delta modulators with various offset cancellation implementations will be described in accordance with at least some embodiments of the present disclosure. With reference initially to FIGS. 10A and 10B, a circuit diagram 1000 depicting a second-order main sigma-delta modulator with a second-order sigma-delta modulator as the auxiliary offset compensation network will be described in accordance with embodiments of the present disclosure. The circuit diagram of FIG. 10A shows a second-order main sigma-delta modulator 1004 connected with a second-order auxiliary offset compensation network 1008. The second-order auxiliary offset compensation network 1008 is shown to include an auxiliary second-order sigma-delta modulator 1012. Details of the auxiliary second-order sigma-delta modulator 1012 are shown in FIG. 10B.

In some embodiments, the auxiliary second-order sigma-delta modulator 1012 is a duplication of the main sigma-delta modulator 1004. This duplication effectively enables the auxiliary second-order sigma-delta modulator 1012 to function as an electrical equivalent of the main second-order sigma-delta modulator 1004. By having this electrical equivalency, the offset cancellation generated by the auxiliary second-order sigma-delta modulator 1012 is capable of properly cancelling out the offset experienced by the main second-order sigma-delta modulator 1004. In simulation of circuit 1000, the offset cancellation is achieved using the auxiliary second-order sigma-delta modulator 1012 as the auxiliary bitsteam generator. The noise floor is not disturbed, and the signal to noise ratio for the circuit 1000 is effectively the same as an ideal/offset-free case.

Figure 11A:
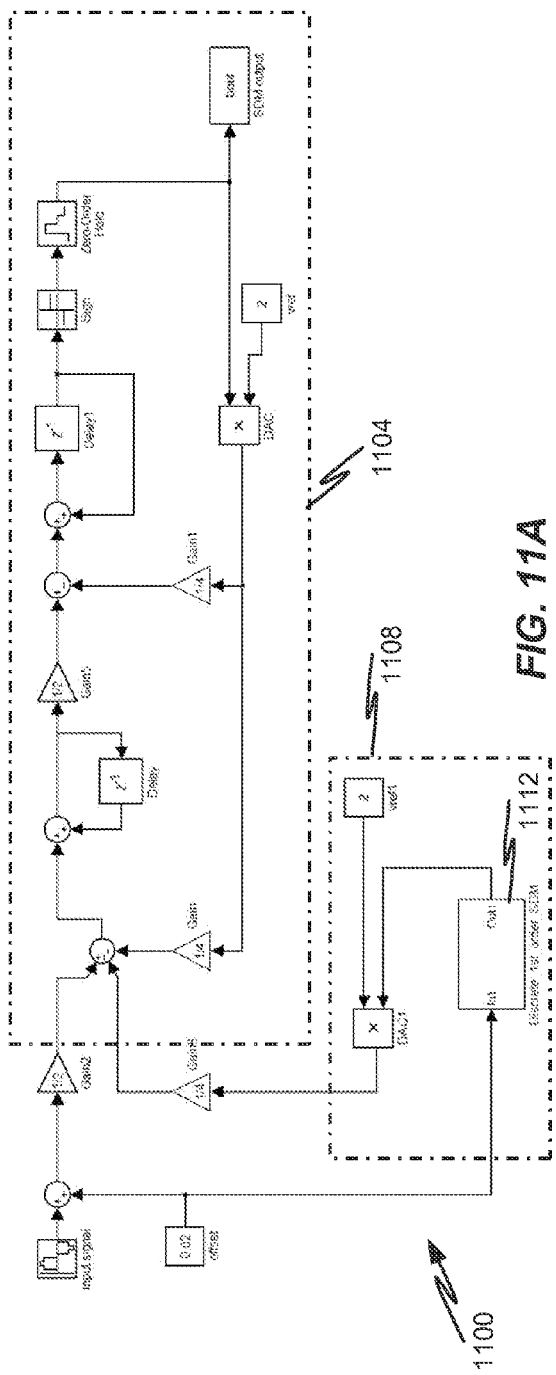
FIG. 11A is a circuit diagram depicting a second-order sigma-delta modulator with a first-order sigma-delta modulator as the auxiliary offset compensation network in accordance with embodiments of the present disclosure.
Figure 11B:
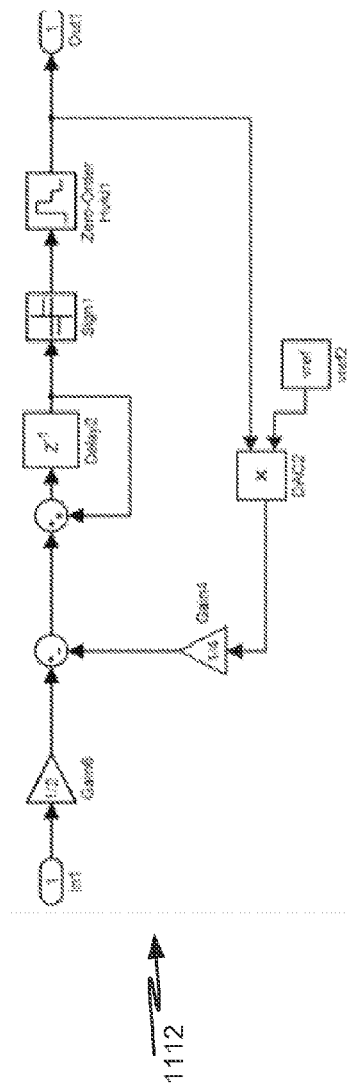
FIG. 11B is a circuit diagram depicting details of the auxiliary first-order sigma-delta modulator in accordance with embodiments of the present disclosure.

With reference now to FIGS. 11A and 11B, a circuit diagram 1100 depicting a second-order sigma-delta modulator with a first-order sigma-delta modulator as the auxiliary offset compensation network will be described in accordance with embodiments of the present disclosure. As compared with circuit 1000, the circuit 1100 includes a discrete auxiliary first-order sigma-delta modulator 1112 in the auxiliary offset compensation network 1108. The main second-order sigma-delta modulator 1104 is similar or identical to modulator 1004, but the auxiliary offset compensation network is different (e.g., a first-order compensation network). FIG. 11B depicts details of the auxiliary first-order sigma-delta modulator 1112. Within the network 1108, the output of the auxiliary first-order sigma-delta modulator 1112 is provided to a second DAC, which subsequently provides the analog representation of the output to the summing node in the main second-order sigma-delta modulator 1104.

In simulation of circuit 1100, the offset cancellation is achieved using the auxiliary first-order sigma-delta modulator 1112 as the auxiliary bitstream generator. As with circuit 1000, the noise floor when implementing circuit 1100 is not disturbed, and the signal to noise ratio of the circuit 1100 is effectively the same as an ideal/offset-free scenario.

Figure 12A:
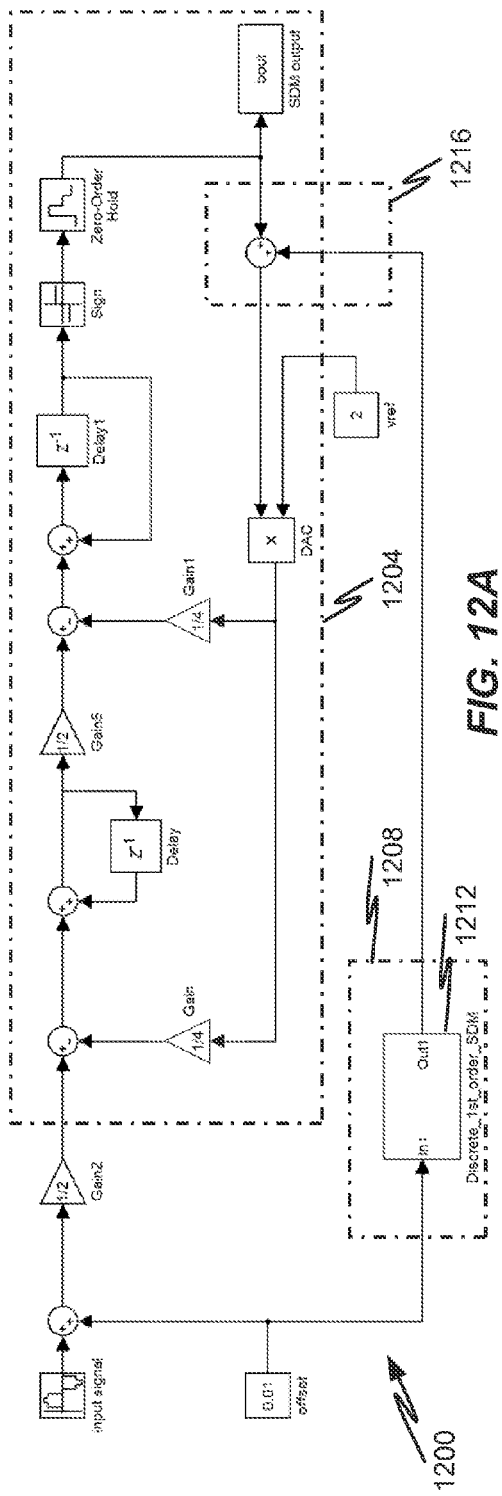
FIG. 12A is a circuit diagram depicting a second-order sigma-delta modulator with a first-order sigma-delta modulator as the auxiliary offset compensation network and using digital summing to realize the feedback in accordance with embodiments of the present disclosure.
Figure 12B:
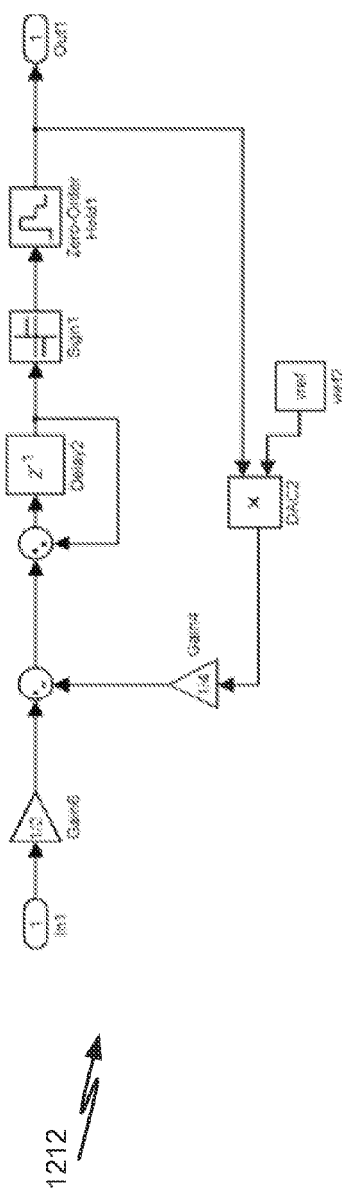
FIG. 12B is a circuit diagram depicting details of the auxiliary first-order sigma-delta modulator in accordance with embodiments of the present disclosure.

With reference now to FIGS. 12A and 12B, a circuit diagram 1200 depicting a second-order sigma-delta modulator with a first-order sigma-delta modulator as the auxiliary offset compensation network and using digital summing to realize the feedback will be described in accordance with embodiments of the present disclosure. The circuit 1200 is similar to circuit 1100, except that the feedback from the auxiliary first-order sigma-delta modulator 1212 of the auxiliary offset compensation network 1208 is fed to the main second-order sigma-delta modulator 1204 via a digital summing node 1216. FIG. 12B depicts details of the auxiliary first-order sigma-delta modulator 1212, which may be similar or identical to the modulator 1112 depicted in FIG. 11B. Again, the circuit 1200 effectively achieves offset cancellation. This particular implementation is similar to that depicted and described in connection with FIG. 5 whereas the implementations of FIGS. 10A, 10B, 11A, and 11B are similar to that depicted and described in connection with FIGS. 6 and 7.

Figure 13:
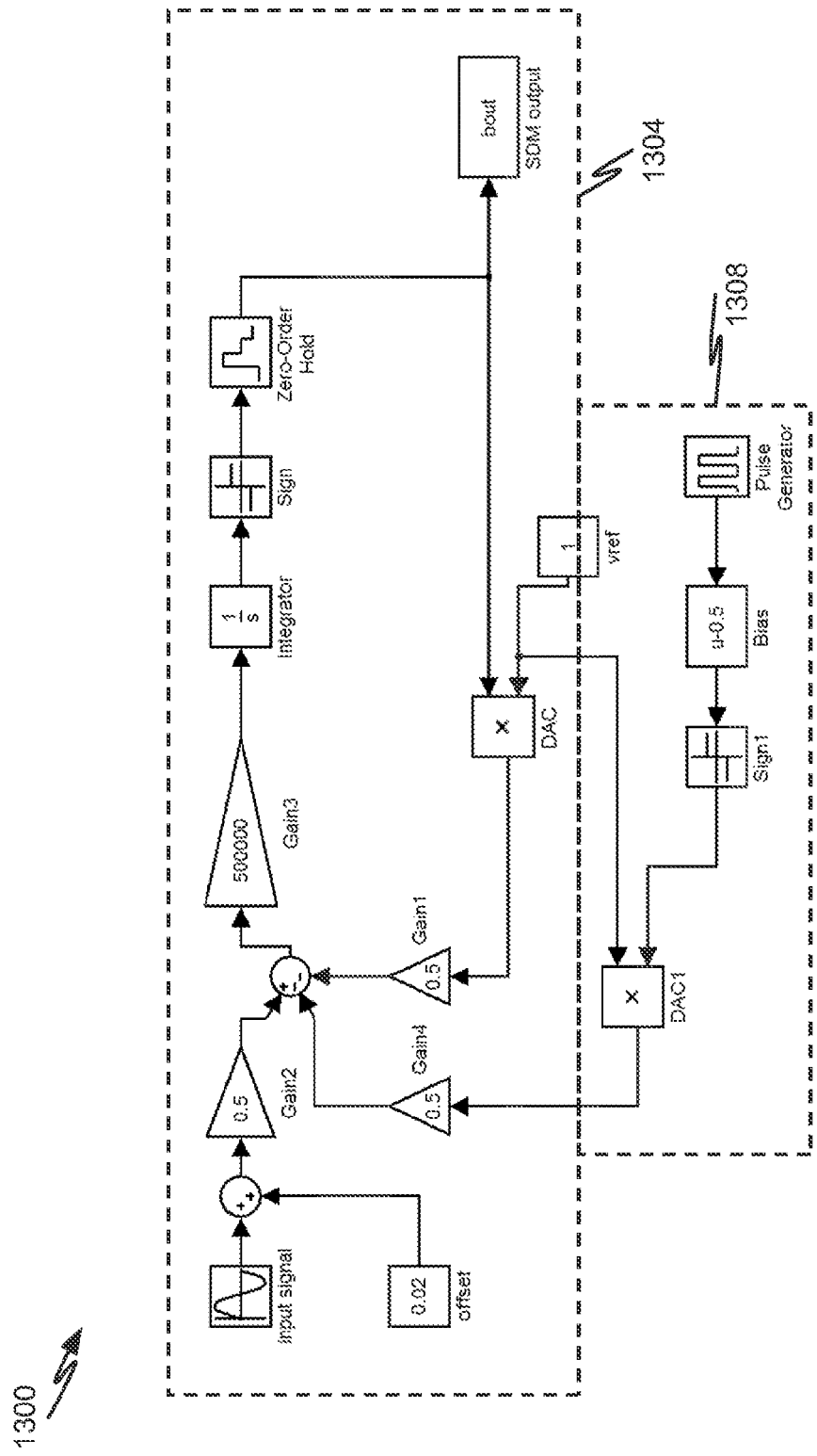
FIG. 13 is a circuit diagram depicting a first-order continuous time sigma-delta modulator with an offset and using a pulse width modulator input branch to compensate the inherent offset in accordance with embodiments of the present disclosure.

With reference now to FIG. 13, a circuit diagram depicting a first-order continuous time sigma-delta modulator with an offset and using a pulse width modulator input branch to compensate the inherent offset will be described in accordance with embodiments of the present disclosure. The circuit 1300 is shown to include a main first-order continuous time sigma-delta modulator 1304 with an inherent 20 mV offset. The circuit 1300 also includes an auxiliary branch 1308 that compensates for the inherent offset in the main sigma-delta modulator 1304. In some embodiments, the auxiliary branch 1308 includes a pulse-width modulated signal. The offset value generated by the auxiliary branch 1308 is converted into duty cycle information and fed back to the main sigma-delta modulator 1304. This particular implementation utilizes a pulse-width modulator in the auxiliary branch 1308 rather than a sigma-delta modulator. However, similar functionality can be achieved with the auxiliary branch 1308 as compared with auxiliary sigma-delta modulators. In particular, the offset at DC is successfully canceled via the auxiliary branch 1308. The noise floor is not raised as with many of the other circuits described herein.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A sigma-delta converter, comprising:
   a main sigma-delta circuit comprising:
      an input configured to receive an analog input signal from an analog input circuit;
      a filter configured to filter out at least one frequency band from the analog input signal thereby resulting in a filtered analog signal;
      a quantizer configured to receive the filtered analog signal from the filter and generate a main circuit digital output signal; and
      a feedback loop including at least one digital-to-analog converter that generates an analog feedback signal for the main sigma-delta circuit, wherein the at least one digital-to-analog converter generates the analog feedback signal based on the main circuit digital output signal and an analog input reference signal received from the analog input circuit; and
   an auxiliary sigma-delta circuit that is electrically matched to the main sigma-delta circuit, wherein the auxiliary sigma-delta circuit is configured to receive the analog input reference signal from the analog input circuit and generate an auxiliary circuit digital output that is incorporated into the feedback loop of the main sigma-delta circuit thereby enabling the main sigma-delta circuit to apply an offset signal that is capable of dynamically changing.

2. The sigma-delta converter of claim 1, wherein the offset signal accounts for offset that is inherently present in the main sigma-delta circuit, and wherein the at least one digital-to-analog converter of the feedback loop in the main sigma-delta circuit is configured to receive a combined digital signal that includes the main circuit digital output signal as well as the auxiliary circuit digital output and then use the combined digital signal to prepare the analog feedback signal.

3. The sigma-delta converter of claim 2, wherein the at least one digital-to-analog converter of the feedback loop in the main sigma-delta circuit is also configured to convert the combined digital signal based on the analog input reference signal from the analog input circuit into an analog representation as part of preparing the analog feedback signal.

4. The sigma-delta converter of claim 1, wherein the at least one digital-to-analog converter is configured to convert the combined digital signal based on the analog input reference signal from the analog input circuit into an analog representation as part of preparing the analog feedback signal.

5. The sigma-delta converter of claim 4, wherein the auxiliary circuit digital output is provided to a second digital-to-analog converter which generates an analog equivalent for the auxiliary circuit digital output, wherein the analog equivalent for the auxiliary circuit digital output is provided as a negative feedback to the main sigma-delta circuit.

6. The sigma-delta converter of claim 5, wherein the analog equivalent for the auxiliary circuit digital output as well as the analog feedback signal generated by the at least one digital-to-analog converter are subtracted from the analog input signal prior to providing the analog input signal to the filter.

7. The sigma-delta converter of claim 1, wherein the main sigma-delta circuit and the auxiliary sigma-delta circuit are provided on a common Integrated Circuit (IC) chip.

8. The sigma-delta converter of claim 1, wherein the main sigma-delta circuit and the auxiliary sigma-delta circuit are provided on a common circuit board.

9. The sigma-delta converter of claim 1, wherein the auxiliary sigma-delta circuit is electrically matched to the main sigma-delta circuit by virtue of both sigma-delta circuits being connected to a common reference signal and by virtue of both sigma-delta circuits operating in substantially the same environmental conditions.

10. The sigma-delta converter of claim 1, wherein the offset signal dynamically changes as a result of changes in at least one of temperature around the analog input circuit, supply voltage provided to the analog input circuit, process variations, and noise.

11. The sigma-delta converter of claim 1, wherein the auxiliary sigma-delta circuit is constructed as a second order sigma-delta modulator.

12. The sigma-delta converter of claim 1, wherein the auxiliary sigma-delta circuit is constructed as a first order sigma-delta modulator.

13. An analog-to-digital conversion system, comprising:
   an analog input circuit that generates an analog input signal;
   a main sigma-delta modulator configured to receive the analog input signal, carry the analog input signal through a main analog channel, and then generate a main circuit digital output signal, wherein the main sigma-delta modulator comprises a feedback loop enabling the main sigma-delta modulator to apply an offset signal at the main analog channel; and
   an auxiliary sigma-delta modulator that is electrically matched with the main sigma-delta modulator, wherein the auxiliary sigma-delta modulator is configured to receive a reference signal that is also applied to the main sigma-delta modulator, wherein the auxiliary sigma-delta modulator utilizes the reference signal to generate an auxiliary circuit digital output that is incorporated into the feedback loop of the main sigma-delta modulator thereby enabling the main sigma-delta modulator to adjust the offset signal applied at the main analog channel.

14. The analog-to-digital conversion system of claim 13, wherein the main sigma-delta modulator comprises a first order sigma-delta modulator.

15. The analog-to-digital conversion system of claim 13, wherein the main sigma-delta modulator comprises a second order sigma-delta modulator.

16. The analog-to-digital conversion system of claim 13, wherein the auxiliary sigma-delta modulator comprises a first order sigma-delta modulator.

17. The analog-to-digital conversion system of claim 13, wherein the auxiliary sigma-delta modulator comprises a second order sigma-delta modulator.

18. The analog-to-digital conversion system of claim 13, wherein the main sigma-delta circuit and the auxiliary sigma-delta circuit are provided on a common Integrated Circuit (IC) chip.

19. An Integrated Circuit (IC) chip, comprising:
- a first sigma-delta modulator configured to receive an analog input signal, carry the analog input signal through a main analog channel, and then generate a first circuit digital output signal, wherein the first sigma-delta modulator comprises a feedback loop enabling the first sigma-delta modulator to apply an offset signal at the main analog channel; and
- a second sigma-delta modulator that is electrically matched with the first sigma-delta modulator, wherein the second sigma-delta modulator is configured to receive a reference signal and utilize the reference signal to generate an auxiliary circuit digital output that is incorporated into the feedback loop of the first sigma-delta modulator thereby enabling the first sigma-delta modulator to adjust the offset signal applied at the main analog channel as operating conditions on the IC chip change.

20. The IC chip of claim 19, wherein the operating conditions on the IC chip change as a result of at least one of supply voltage changes, process variations occur, noise, and temperature changes.

\* \* \* \* \*